(12) United States Patent
Solas et al.

(10) Patent No.: US 11,942,407 B2
(45) Date of Patent: Mar. 26, 2024

(54) SEMICONDUCTOR CHIP PACKAGES HAVING BOND OVER ACTIVE CIRCUIT (BOAC) STRUCTURES

(71) Applicant: TEXAS INSTRUMENTS INCORPORATED, Dallas, TX (US)

(72) Inventors: Jeffrey Salvacion Solas, Angeles (PH); Maricel Fabia Escaño, Angeles (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 193 days.

(21) Appl. No.: 17/463,077

(22) Filed: Aug. 31, 2021

(65) Prior Publication Data

US 2023/0068086 A1 Mar. 2, 2023

(51) Int. Cl.
*H01L 23/48* (2006.01)
*H01L 21/768* (2006.01)
*H01L 23/498* (2006.01)

(52) U.S. Cl.
CPC .. *H01L 23/49827* (2013.01); *H01L 21/76877* (2013.01); *H01L 21/76898* (2013.01); *H01L 23/481* (2013.01)

(58) Field of Classification Search
CPC ......... H01L 23/00; H01L 23/31; H01L 23/48; H01L 23/481; H01L 23/495; H01L 23/498; H01L 23/3157; H01L 23/49827; H01L 23/49551; H01L 24/02; H01L 24/08; H01L 24/42; H01L 21/768; H01L 21/76877; H01L 21/76898; H01L 2224/32245; H01L 2224/48247; H01L 2224/49171; H01L 2224/73265
USPC .......................... 257/774; 438/629, 637, 639
See application file for complete search history.

(56) References Cited

U.S. PATENT DOCUMENTS

| 2004/0119166 A1* | 6/2004 | Sunohara | H01L 23/5389 257/E21.705 |
| 2020/0091126 A1* | 3/2020 | Lin | H01L 24/20 |
| 2021/0098423 A1* | 4/2021 | Chen | H01L 21/76807 |

* cited by examiner

*Primary Examiner* — Chuong A Luu
(74) *Attorney, Agent, or Firm* — Dawn Jos; Frank D. Cimino (57) ABSTRACT

In some examples a method comprises forming an insulating member over a circuit on a device side of a semiconductor die, removing a portion of the insulating member to produce a cavity, and forming a seed layer on the insulating member and within the cavity. In addition, the method includes forming a conductive member on the seed layer in the cavity, wherein the conductive member comprises a plurality of layers of different metal materials. Further, the method includes removing the seed layer from atop the insulating member, outside the cavity, after forming the conductive member in the cavity such that a remaining portion of the seed layer is positioned between the conductive member and the insulating member.

12 Claims, 8 Drawing Sheets

SEMICONDUCTOR CHIP PACKAGES HAVING BOND OVER ACTIVE CIRCUIT (BOAC) STRUCTURES

BACKGROUND

A semiconductor chip package may comprise an active circuit (or more simply a "circuit") formed on a device side of a semiconductor die and coupled to a plurality of conductive terminals via wire bonds. Some semiconductor chip packages may comprise a bond over active circuit (BOAC) structure comprising conductive (e.g., metallic) members formed of multiple layers of different metal materials positioned atop the circuit and coupled to the terminals via the wire bonds. Such semiconductor chip packages may be referred to herein as BOAC semiconductor chip packages.

SUMMARY

In accordance with at least one example of the disclosure, a method comprises forming an insulating member over a circuit on a device side of a semiconductor die, removing a portion of the insulating member to produce a cavity, and forming a seed layer on the insulating member and within the cavity. In addition, the method comprises forming a conductive member on the seed layer in the cavity, wherein the conductive member comprises a plurality of layers of different metal materials. Further, the method comprises removing the seed layer from atop the insulating member, outside the cavity, after forming the conductive member in the cavity such that a remaining portion of the seed layer is positioned between the conductive member and the insulating member.

In accordance with at least one example of the disclosure, a BOAC semiconductor die package comprises a semiconductor die having a device side comprising a circuit. In addition, the BOAC semiconductor die package comprises a conductive member electrically coupled to the circuit. The conductive member comprises an outer surface that is spaced away from the circuit and a plurality of side surfaces extending from the outer surface, and the conductive member comprises a plurality of layers of different metal materials. Further, the BOAC semiconductor die package comprises a seed layer abutting the plurality of side surfaces of the conductive member. Still further, the BOAC semiconductor die package comprises an insulating member abutting the seed layer such that the seed layer is between the plurality of side surfaces and the insulating member.

In accordance with at least one example of the disclosure, BOAC semiconductor die package comprises a semiconductor die having a device side comprising a circuit. In addition, the BOAC semiconductor die package comprises an insulating member covering the circuit. Further, the BOAC semiconductor die package comprises a conductive member positioned within the insulating member and electrically coupled to the circuit. The conductive member comprises a longitudinal axis, an outer surface axially spaced from the circuit along the longitudinal axis, and an outer perimeter extending from the outer surface toward the circuit, and the conductive member comprises a plurality of layers of different metal materials. Still further, the BOAC semiconductor die package comprises a seed layer surrounding the conductive member along the outer perimeter within the insulating member.

BRIEF DESCRIPTION OF THE DRAWINGS

For a detailed description of various examples, reference will now be made to the accompanying drawings in which.

DETAILED DESCRIPTION

A BOAC semiconductor chip package may comprise a plurality of multi-metal conductive members that are coupled to and positioned atop a circuit on a device side of a semiconductor die. The conductive members may be positioned within an insulating member to prevent electrical shorts between adjacent conductive members during operations. When manufacturing a BOAC semiconductor chip package, a seed layer may initially be formed on the circuit (or on a layer positioned atop the circuit) on the device side of the semiconductor die, and then a conductive member may be formed atop the seed layer. After formation of the conductive members, selective portions of the seed layer (e.g., such as those portions of the seed layer that are not aligned with the conductive members) may be removed (e.g., etched) prior to formation of the insulating member that is to surround the conductive members. However, the process of removing these select portions of the seed layer may also cause deterioration and/or removal of portions of the conductive members themselves (which may be formed of generally the same conductive material as the seed layer). As a result, this manufacturing procedure for the semiconductor die of a BOAC semiconductor chip package may result in conductive members that are reduced in size (e.g., cross-sectional area) and/or damaged so that electrical performance of the BOAC semiconductor chip package may be reduced (or even compromised).

Accordingly, examples disclosed herein include BOAC semiconductor chip packages and manufacturing methods for semiconductor dies of BOAC semiconductor chip packages that prevent the deterioration of the conductive members caused by seed layer removal. In some examples, the semiconductor die of a BOAC semiconductor chip package may be manufactured by forming an insulating member atop the circuit before formation of the seed layer and conductive member. By adjusting the order of formation of these components, the conductive member may be protected from deterioration during the later steps for removing the seed layer. As a result, through use of the example BOAC semiconductor chip packages described herein (and the manufacturing methods therefor), the instances of conductive member deterioration and/or damage during manufacturing may be reduced, thereby increasing reliability of the BOAC semiconductor chip packages.

Figure 1A:
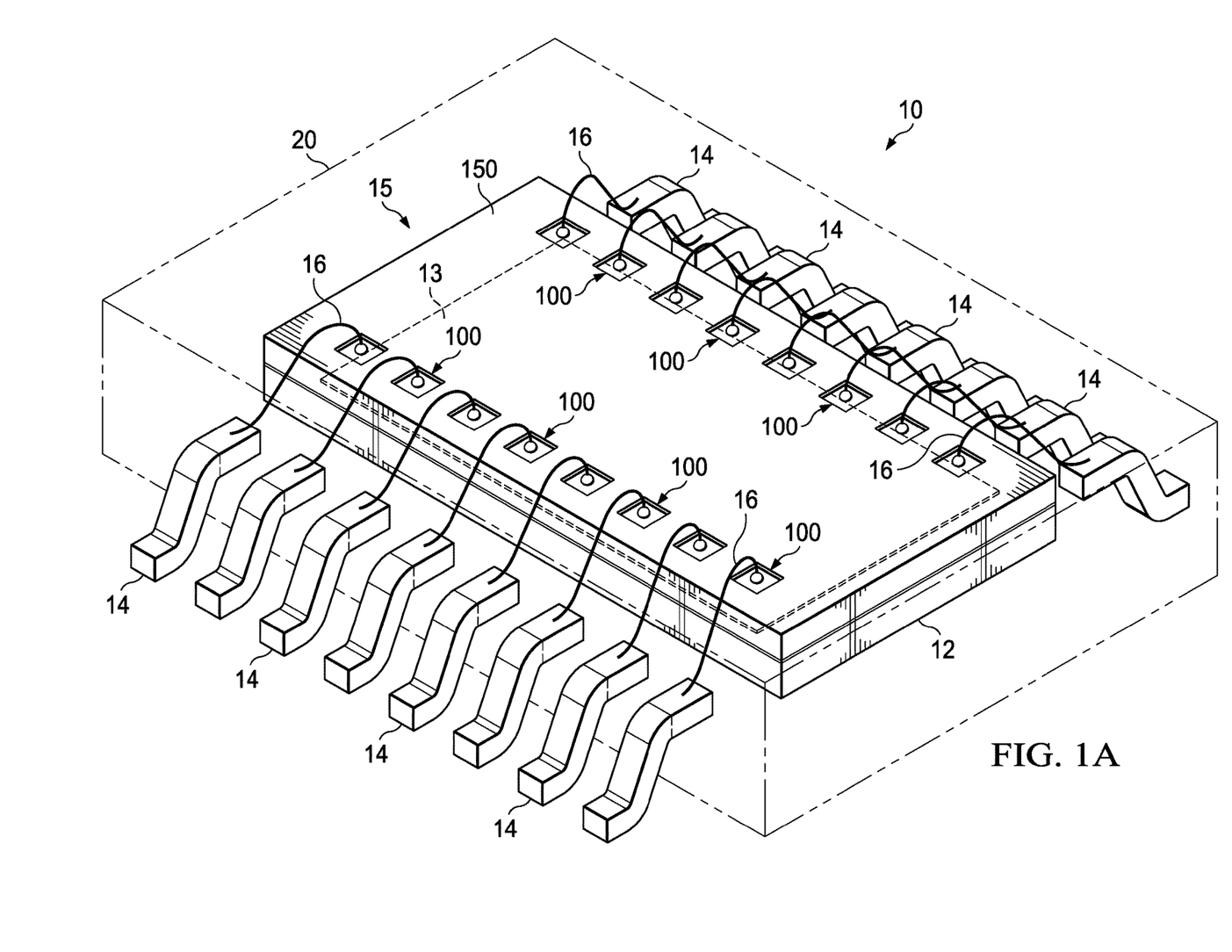
FIG. 1A is a perspective view of a BOAC semiconductor chip package according to some examples.
Figure 1B:
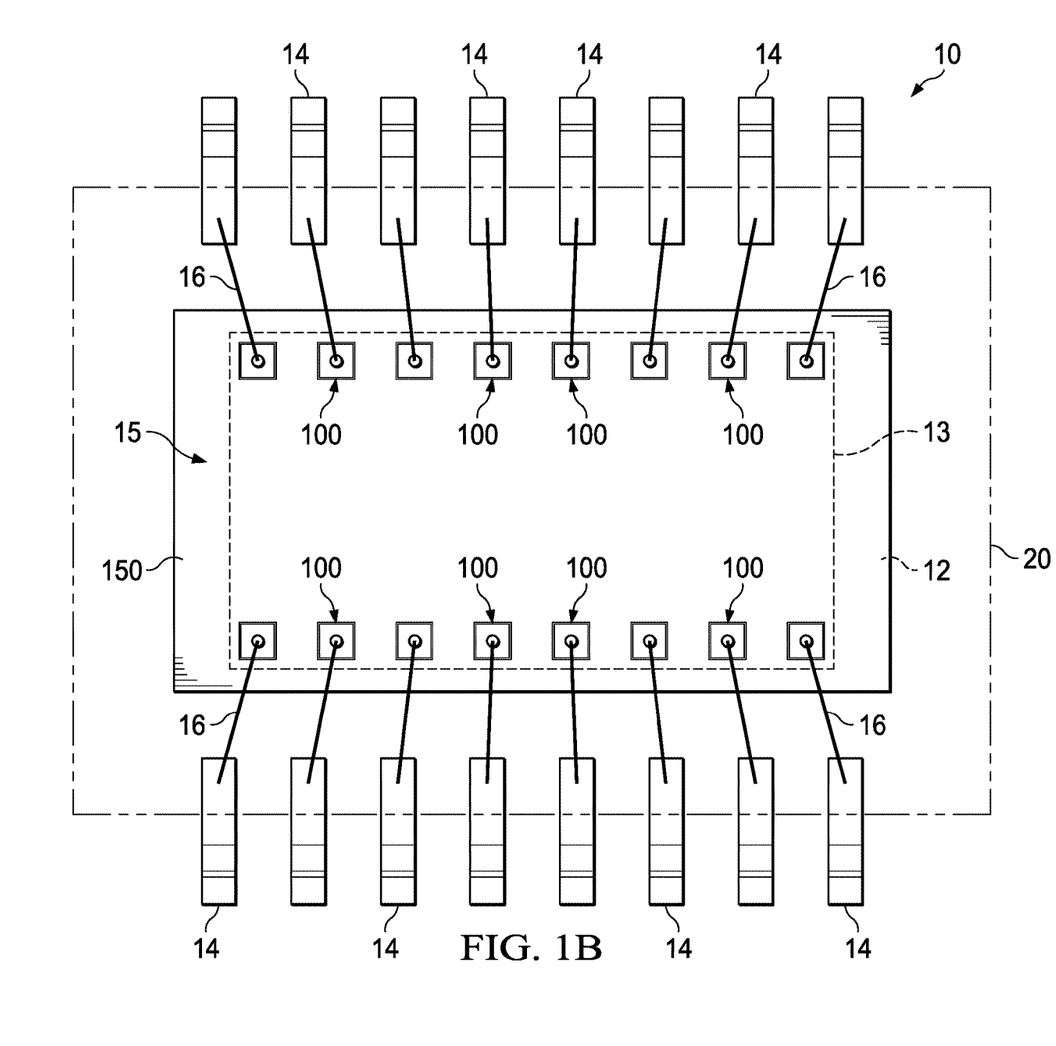
FIG. 1B is a top view of the BOAC semiconductor chip package of FIG. 1A according to some examples.

Referring now to FIGS. 1A and 1B, a BOAC semiconductor chip package 10 according to some examples disclosed herein is shown. For simplicity, the BOAC semiconductor chip package 10 may be referred to as "chip package 10." Chip package 10 comprises a semiconductor die 12 having an active circuit 13 (or more simply "circuit 13") formed on a device side 15 thereof.

A BOAC structure comprising a plurality of conductive members 100 is formed atop of and coupled to circuit 13. The conductive members 100 may comprise a plurality of layers of different metal materials that are positioned within (e.g., embedded in) an insulating member 150 that is to prevent electrical shorts between the adjacent conductive members 100 during operations (that is, the conductive members 100 are electrically insulated from one another via the insulating member 150). The insulating member 150 covers at least a portion of the device side 15 of semiconductor die 12.

The conductive members 100 may be coupled to conductive terminals 14 via bond wires 16. In some examples, the conductive terminals 14 may comprise so-called gull-wing leads. However, in some examples, the semiconductor chip package 10 may comprise a quad flat no-lead (QFN) package and the conductive terminals 14 may be arranged and designed for use therein.

A mold compound 20 (e.g., a polymer or resin material) may cover the semiconductor die 12, bond wires 16, and a portion of the conductive terminals 14. The mold compound 20 may protect the components of chip package 10 from the outside environment (e.g., specifically from dust, liquid, light, contaminants in the outside environment), and may prevent undesired contact with conductive surfaces or members on the chip package 10 during operations.

Figure 2A:
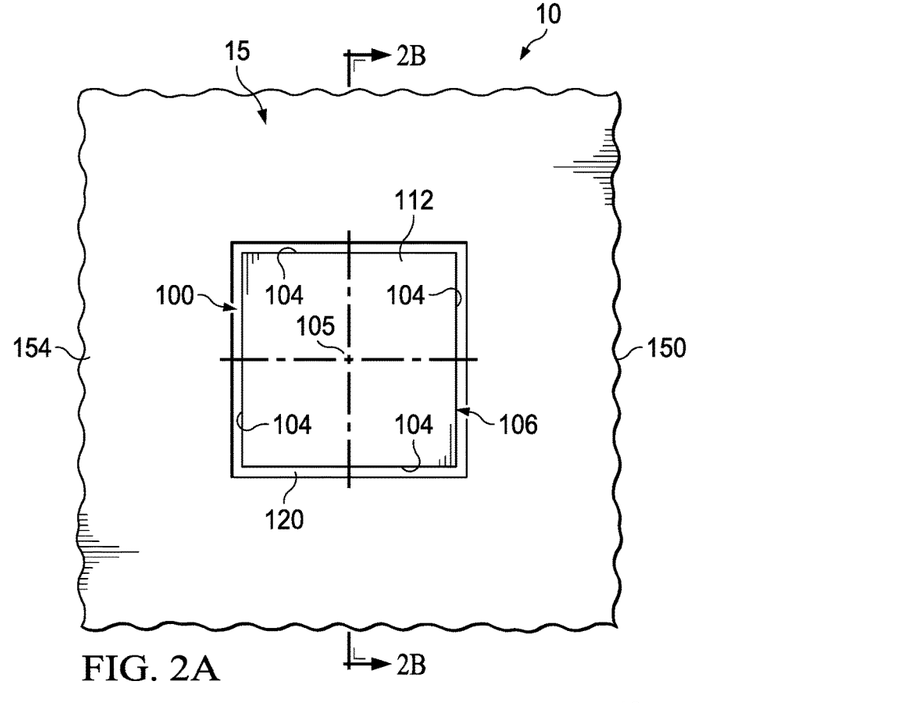
FIG. 2A is a top view of a conductive member on a semiconductor die of a BOAC semiconductor chip package according to some examples.
Figure 2B:
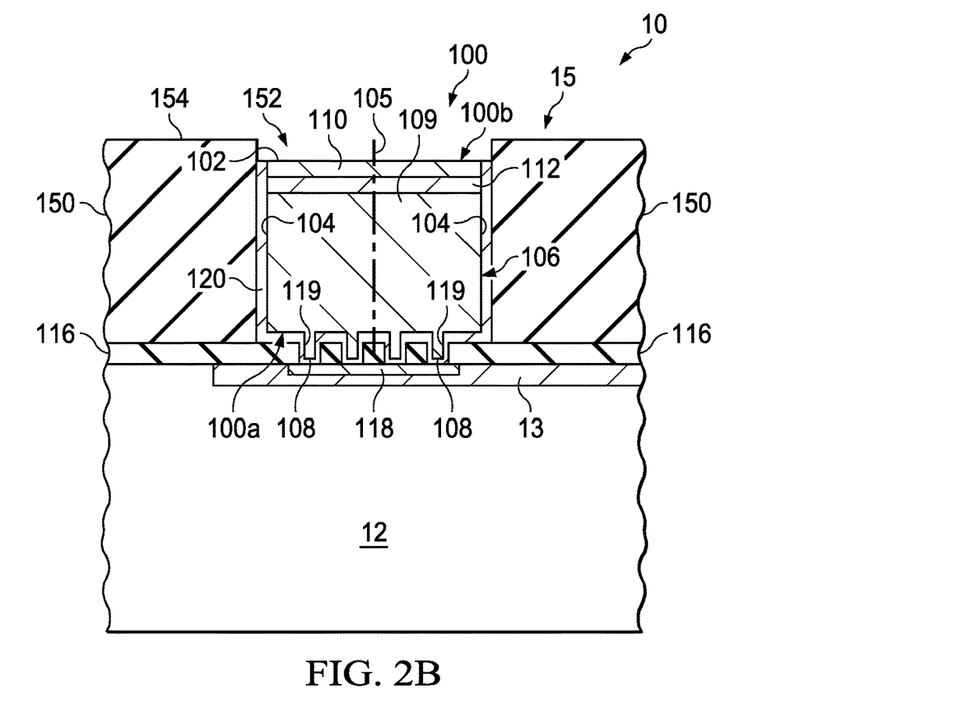
FIG. 2B is a cross-sectional view of the conductive member of FIG. 2A according to some examples.

Referring now to FIGS. 2A and 2B, one of the conductive members 100 on device side 15 of semiconductor die 12 (FIGS. 1A and 1B) is shown, and each of the conductive members 100 may be similarly configured. Thus, the description below will be applied to a single conductive member 100, but the following description may be applied to describe the structure of each conductive member 100 included on semiconductor die 12 (FIGS. 1A and 1B).

Conductive member 100 includes a longitudinal axis 105, a first or inner end 100a, and a second or outer end 100b opposite inner end 100a. Inner end 100a may be coupled to circuit 13 such that outer end 100b is spaced away from circuit 13 along longitudinal axis 105. In some examples, longitudinal axis 105 extends normally or perpendicular relative to a plane of circuit 13.

Inner end 100a may comprise a plurality of projections 108 that are engaged with one or more conductive terminals 118 defined on or coupled to circuit 13. Conductive terminal(s) 118 may conduct electrical current to and from circuit 13 during operations. Outer end 100b comprises an outer surface 102. In some examples, outer surface 102 comprises a planar (or substantially planar) surface that extends radially or perpendicularly relative to longitudinal axis 105. Thus, the outer surface 102 is spaced from circuit 13 along longitudinal axis 105.

As previously described, conductive member 100 may comprise a plurality of layers of different metal materials. Thus, conductive member 100 may comprise a plurality of different metal layers. For instance, in some examples, the conductive member 100 may comprise a first portion 109 comprising a first metal material, a second portion 112 atop the first portion 109 that comprises a second metal material, and a third portion 110 atop the second portion 112 that comprises a third metal material. The first portion 109 may comprise a majority of the conductive members 100 and may extend (and include) the projections 108. The second portion 112 and third portion 110 may comprise metallic layers that are placed atop the first portion 109. In some examples, the first portion 109 may have a total thickness of 10 micrometers (μm), while the second portion 112 and third portion 110 may each have a total thickness of 3 μm. Without being limited to this or any other theory, the thicknesses of the first portion 109, second portion 112, and third portion 110 may allow conductive member 100 (or portions thereof) to act as a stress buffer during operations.

In some examples, the first portion 109 may comprise Copper (Cu), the second portion 112 may comprise Nickel (Ni), and the third portion 110 may comprise Palladium (Pd). The third portion 110 (e.g., comprising the layer of Pd) may form the outer surface 102 of conductive member 100. During operations, the materials forming the second portion 112 and third portion 110 (e.g., Ni and Pd, respectively) may, along with the insulating member 150, protect the material forming the first portion 109 (e.g., Cu) from oxidation.

A plurality of side surfaces 104 extend between (e.g., axially between) the inner end 100a and the outer end 100b. Thus, the plurality of side surfaces 104 may extend from outer surface 102 toward inner end 100a. As best shown in FIG. 2A, the conductive member 100 may comprise a square or generally rectangular cross-section in some examples, such that there is a total of four side surfaces 104. Together, the plurality of side surfaces 104 may define an outer perimeter 106 of conductive member 100.

Referring still to FIGS. 2A and 2B, as previously described, conductive member 100 is positioned (e.g., embedded) within insulating member 150 that covers circuit 13 on device side 15. An insulating layer 116 may cover circuit 13 that is positioned below insulating member 150. The insulating layer 116 may comprise passivation overcoat (PO). The projections 108 may extend through apertures or openings 119 in the insulating layer 116 to couple with conductive terminal(s) 118.

The insulating member 150 is positioned atop the insulating layer 116, and the conductive member 100 may be positioned within a corresponding recess or cavity 152 formed in the insulating member 150. In some examples, the outer surface 102 (and thus also outer ends 100b) of conductive members 100 may be recessed inward from (or below) an outer surface 154 of insulating member 150. In addition, in some examples the insulating member 150 may comprise polyimide (PI).

A conductive seed layer 120 (or more simply "seed layer 120") is positioned within the cavity 152, between the conductive member 100 and the insulating member 150 (and insulating layer 116). Specifically, seed layer 120 may extend along and abut each of the plurality of side surfaces 104 (and thereby about the outer perimeter 106) and along the inner end 100a (including projections 108). However, the seed layer 120 may not extend over the outer surface 102. Thus, the seed layer 120 may surround the conductive member 100 (including the first portion 109, second portion 112, and third portion 110) within the cavity 152 of insulating member 150, so that seed layer 120 also abuts the insulating member 150 within cavity 152. Thus, the seed layer 120 may be positioned between the outer perimeter 106, formed by the plurality of side surfaces 104 (including along the first portion 109, second portion 112, and third portion 110), and the insulating member 150 within cavity 152. As will be described in more detail below, the seed layer 120 may be initially positioned within the cavity 152 so as to allow formation of the conductive member 100 during manufacturing of chip package 10 (FIGS. 1A and 1B).

The thickness of seed layer 120 is from 1800 to 2200 Angstroms (from 0.18 to 0.22 micrometers—μm). Without being limited to this or any other theory, a thickness of seed layer 120 within this range may provide sufficient thickness for plating additional copper metal, and may provide sufficient shear strength to seed layer 120, but not require an excess amount of metallic material (e.g., which may result in longer and more expensive manufacturing processes, and which may be more difficult to remove in subsequent manufacturing steps as described in more detail below). In some examples, the seed layer 120 comprises pure, or substantially pure Cu (e.g., 99.9% Cu).

Figure 3A:
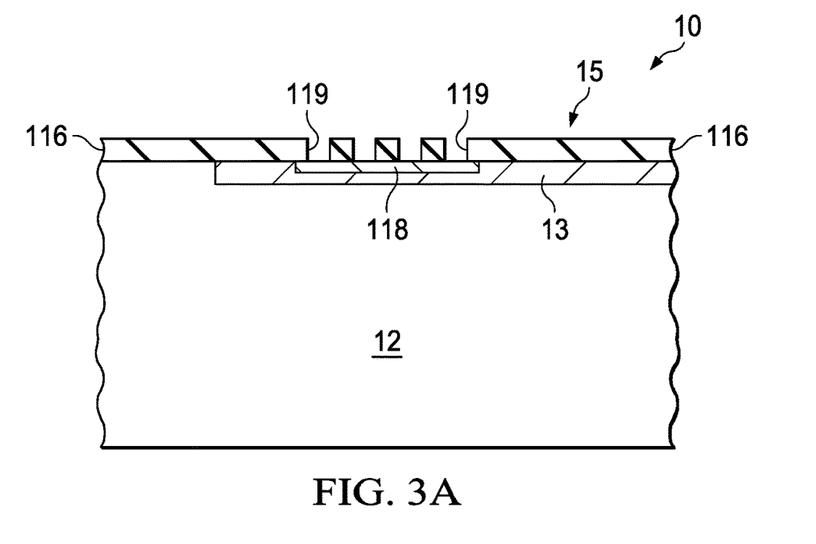
FIGS. 3A-3H are sequential cross-sectional views showing a manufacturing process for a semiconductor die of a BOAC semiconductor chip package according to some examples.
Figure 3B:
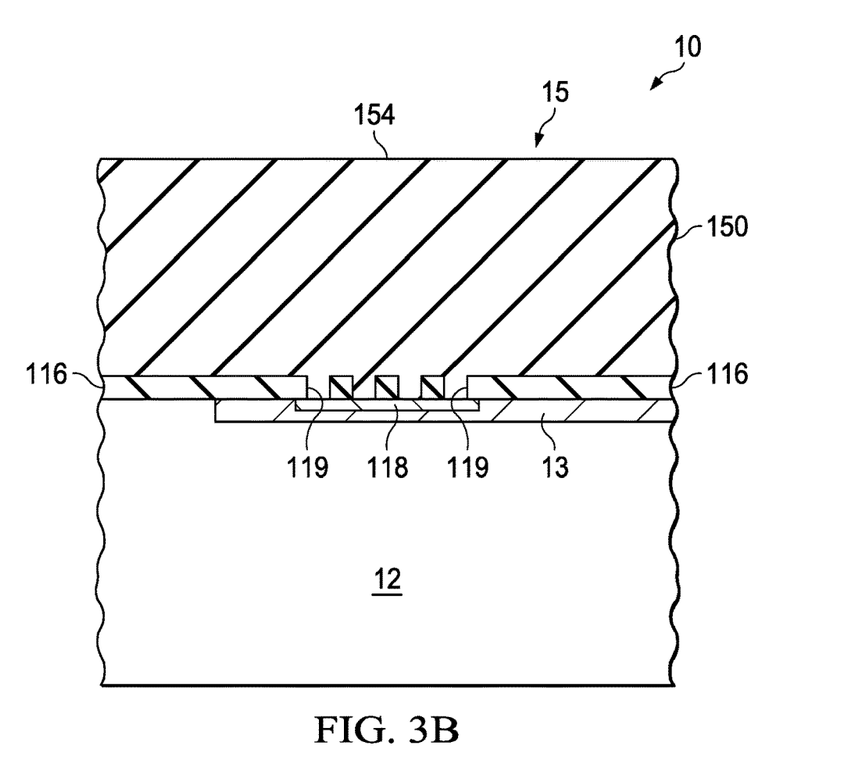
Figure 3C:
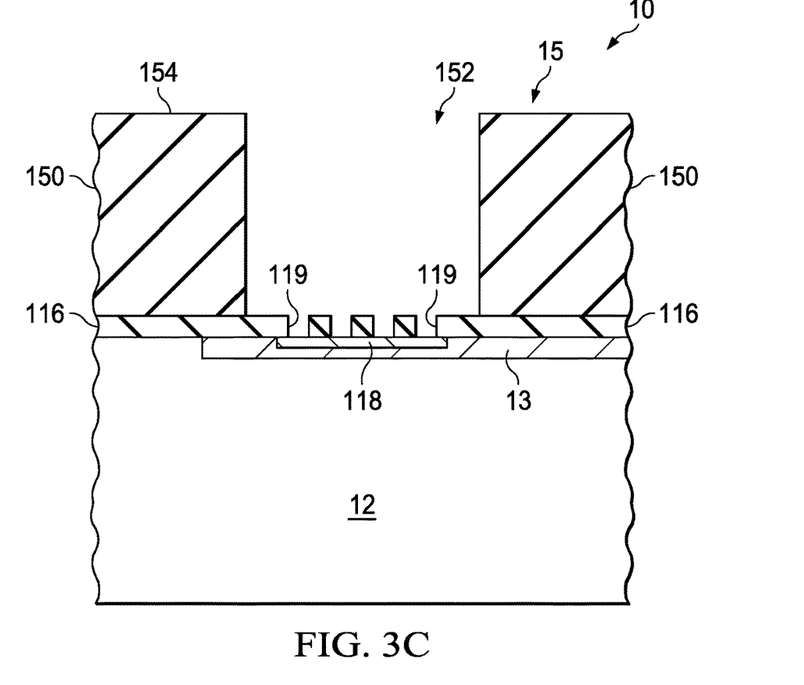
Figure 3D:
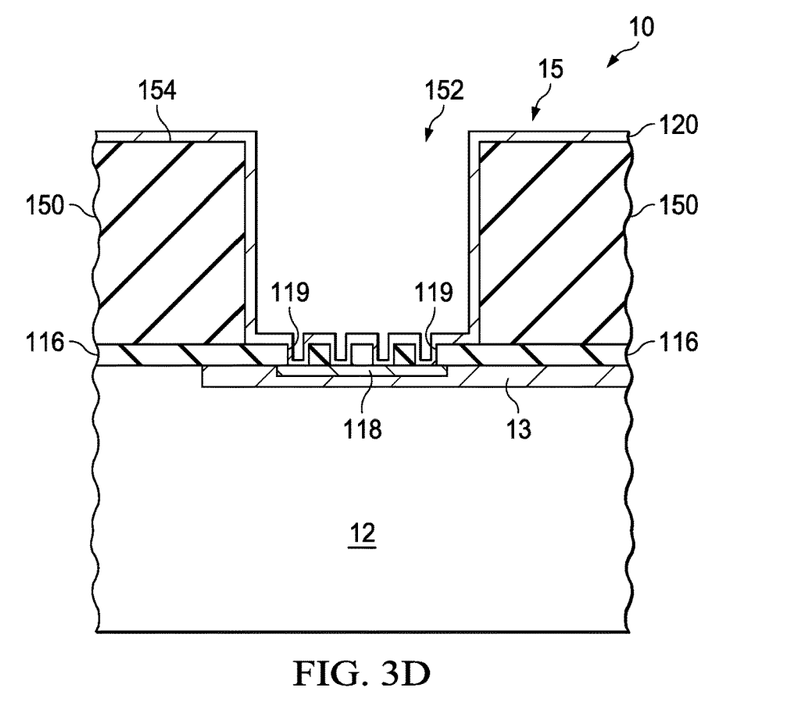
Figure 3E:
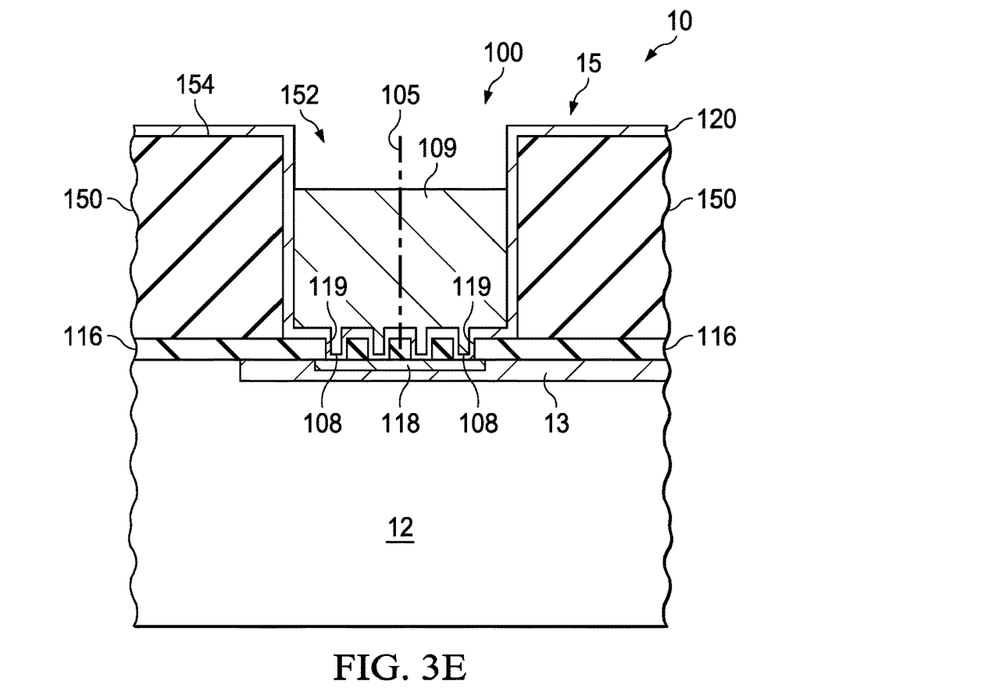
Figure 3F:
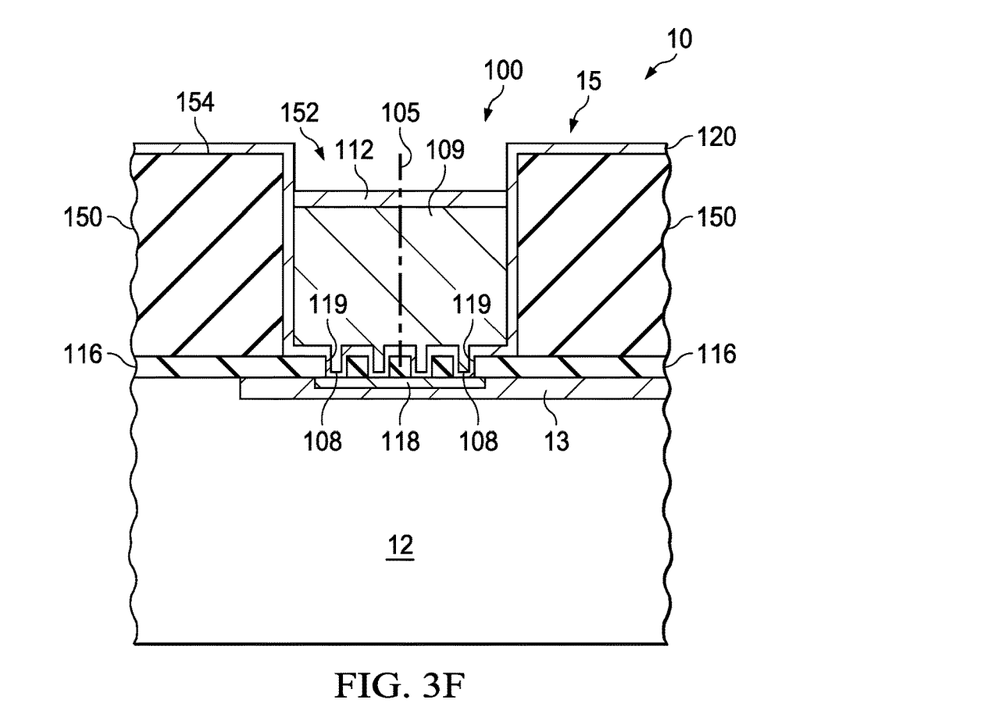
Figure 3G:
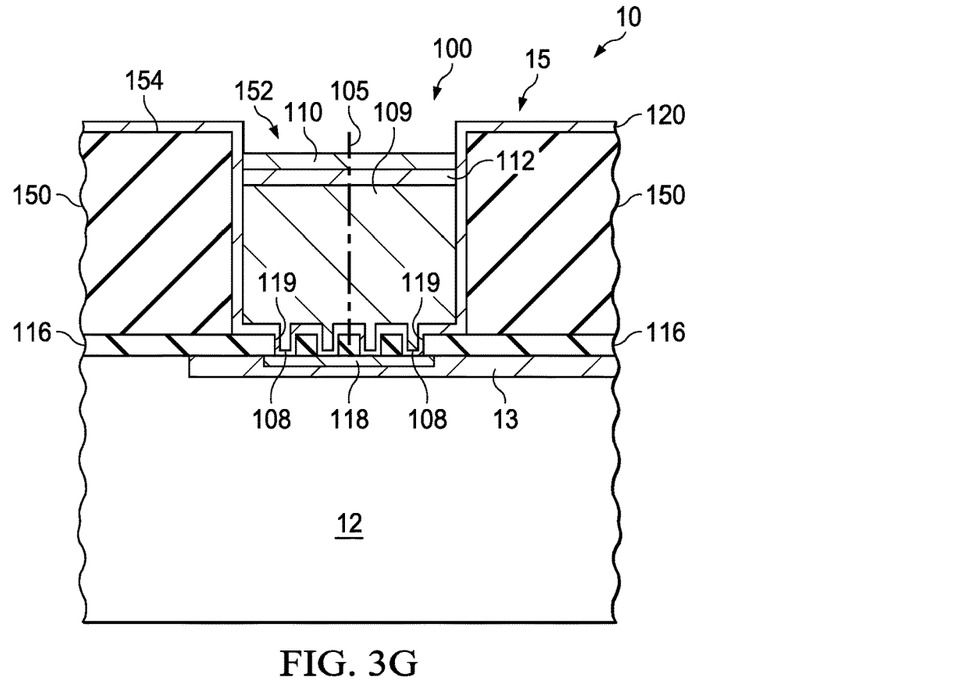
Figure 3H:
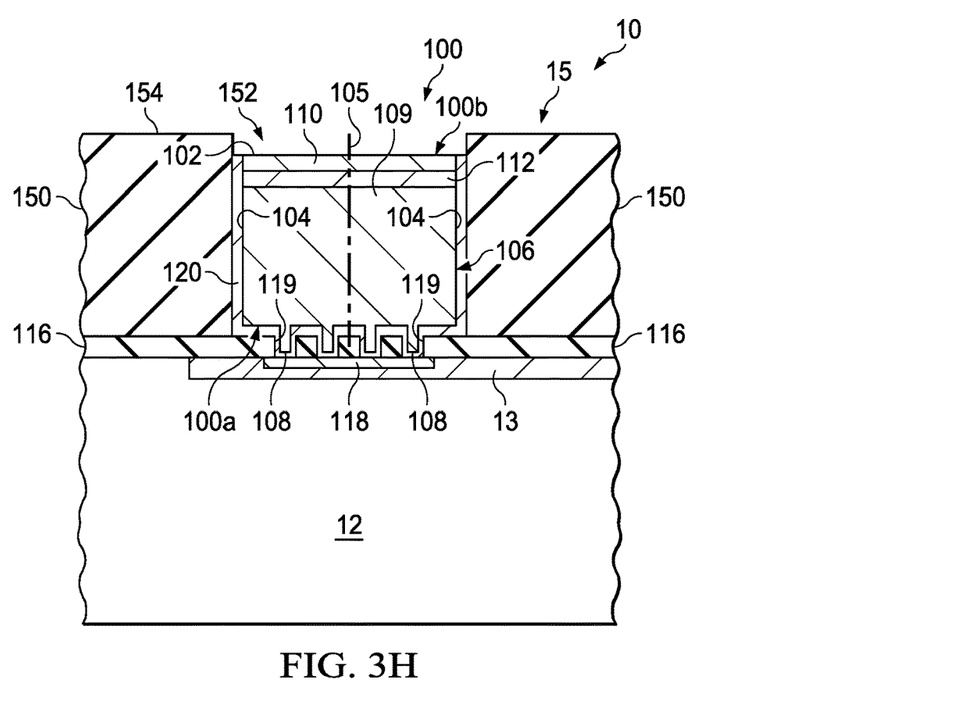
Figure 4:
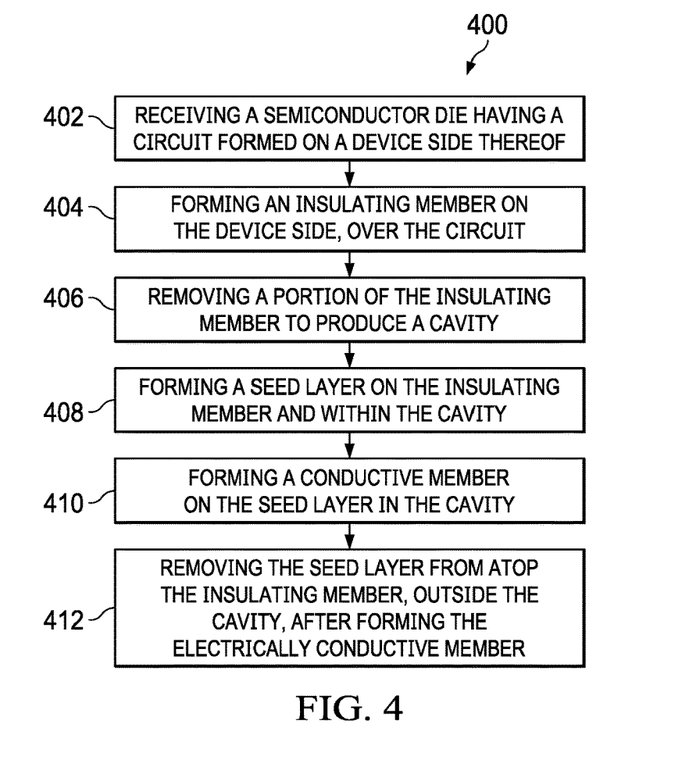
FIG. 4 is a flow diagram of a method for manufacturing a semiconductor die of a BOAC semiconductor chip package according to some examples.

FIGS. 3A-3H illustrate a process for manufacturing a semiconductor die for a BOAC semiconductor chip package (e.g., semiconductor die 12 of chip package 10) according to some examples. In addition, FIG. 4 is a flow diagram of a method 400 for manufacturing a semiconductor die of a BOAC semiconductor chip package having a plurality of conductive members according to some examples. Accordingly, FIGS. 3A-3H and 4 are described in parallel.

FIGS. 3A-3H show various manufacturing steps applied to a single conductive member 100 positioned on a device side 15 of a semiconductor die 12. In various examples, these manufacturing steps may be carried out simultaneously for a plurality of conductive members 100; however, these additional features have not been specifically depicted in the drawings to simplify this description. In addition, in some examples, a plurality of semiconductor dies for BOAC semiconductor die packages may be manufactured according to the example methods described herein simultaneously on a semiconductor wafer. As a result, in some examples, the manufacturing steps described below may be applied to a plurality of semiconductor dies on a semiconductor wafer before the dies are separated or singulated for later incorporation within separate BOAC semiconductor die packages.

Method 400 begins at block 402 by receiving a semiconductor die having a circuit (e.g., circuit 13) formed on a device side thereof. As shown in FIG. 3A, the circuit 13 may be covered by insulating layer 116 and may include one or more conductive terminal 118 coupled to circuit 13 as previously described. A plurality of apertures 119 may be formed in the insulating layer 116 that expose the conductive terminal(s) 118 (or portions thereof).

In addition, method 400 includes forming an insulating member on the device side, over the circuit at block 404. As shown in FIG. 3B, the insulating member 150 may comprise PI as previously described above, and may cover the circuit 13 and insulating layer 116 on device side 15 of semiconductor die 12.

Further, method 400 includes removing a portion of the insulating member to produce a cavity at block 406. For instance, as shown in FIG. 3C, the cavity 152 may be formed in the insulating member 150 via a photolithography process. In particular, a photoresist material (e.g., a photopolymeric material, a photodecomposing material, a photocrosslinking material) may be applied to the top of the insulating member 150. Next, portions of the photoresist material are exposed to ultraviolet (UV) light through a photomask (not shown) to chemically alter the photoresist material in these select portions. Thereafter, a developer solution (e.g., sodium hydroxide, tetramethylammonium hydroxide) may be applied to the photoresist material to remove the photoresist material in the portions that were exposed to the UV light. As a result, the portions of the insulating member 150 are exposed in the areas where the photoresist material was removed, and these portions of insulating member 150 may then be removed (e.g., chemically removed) to form the cavity 152.

Still further, method 400 includes forming a seed layer on the insulating member and within the cavity at block 408. Specifically, as shown in FIG. 3D, a seed layer 120 of conductive material (e.g., Cu) is applied to the insulating member 150 and within the cavity 152 via sputtering or other suitable technique. The seed layer 120 may extend over the insulating member 150 and within the cavity 152 (including within the apertures 119 so as to contact conductive terminal(s) 118).

Also, method 400 includes forming a conductive member on the seed layer in the cavity at block 410. Specifically, as shown in FIG. 3E additional conductive material (e.g., Cu) may be applied to the seed layer 120 within the cavity 152 to form the first portion 109 of a conductive member 100 as previously described. In particular, in some examples, a photoresist material may be applied to the seed layer 120 that is then selectively removed within the cavity 152 via a photolithography process as previously described. Thereafter, conductive material (e.g., Cu) of the first portion 109 may be grown (e.g., via electrical plating techniques) over the exposed portions of the seed layer 120 within cavity 152.

Next, the second portion 112 and third portion 110 of the conductive member 100 may be formed on the first portion 109 within the cavity 152 so as to form the outer surface 102 of conductive member 100 as previously described. The second portion 112 and third portion 110 may be formed within the cavity 152 in a similar manner to the first portion 109, except that no initial seed layer (e.g., seed layer 120) may be deposited onto the first portion 109 or second portion 112 to initiation deposition of the second portion 112 and third portion 110, respectively, according to some examples.

Finally, method 400 includes removing a seed layer from atop the insulating member after forming the electrically conductive member at block 412. Specifically, as shown in FIGS. 3G and 3H, the seed layer 120 may be removed from atop the insulating member 150, in the areas outside of the cavities 152 (e.g., along the outer surface 154), so that the seed layer 120 is maintained within the cavity 152, between the conductive member 100 and the insulating member 150 as previously described. In addition, in some examples, the portion of the seed layer 120 that extends from the outer surface 154, into the cavity 152 to the outer surface 102 may also be removed during this process. In some examples, these portions of the seed layer 120 may be removed via an etching process (e.g., chemically or via plasma).

During the above-described manufacturing process for a BOAC semiconductor chip package (e.g., chip package 10), the insulating member 150 is formed before formation of the conductive member(s) 100. As a result, the conductive member(s) 100 are protected from damage due to the subsequent etching process to remove the excess portions of seed layer 120. Accordingly, the above-described manufacturing process for chip package 10 may lead to fewer instances of damaged conductive members, thereby increasing manufacturing reliability overall.

Figure 5:
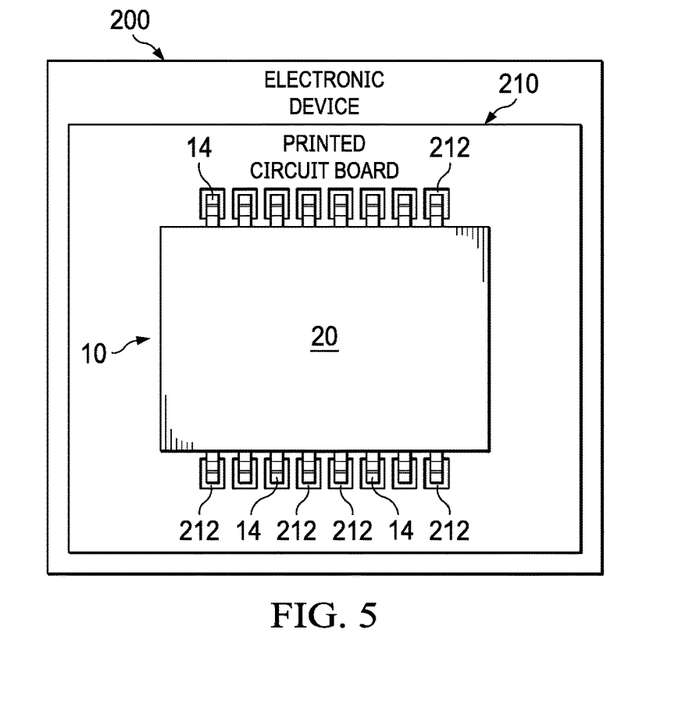
FIG. 5 is a block diagram of an electronic device including a BOAC semiconductor chip package according to some examples.

Referring now to FIG. 5, a block diagram of an electronic device 200 including a BOAC semiconductor chip package 10 according to some examples is shown. In particular, the electronic device 200 may be a laptop computer, a notebook computer, a desktop computer, a smartphone, an appliance (e.g., a refrigerator, a laundry machine, an oven, a toaster), a television, an automobile or a component within an automobile, an aircraft or a component within an aircraft, a water vehicle or a component within a water vehicle, or any other type of device containing one or more electronic components.

In some examples, the electronic device 200 includes a printed circuit board (PCB) 210. The BOAC semiconductor chip package 10 is coupled to the PCB 210 (e.g., via solder coupled between the conductive terminals 14 and corresponding conductive surfaces 212 on PCB 210). During use of the electronic device 200, the BOAC semiconductor chip package 10 may receive power and/or data signals and may perform a function or functions that contribute to the overall use and functionality of the electronic device 200. Other components (e.g., such as other semiconductor chip packages and/or other electronic devices) may be coupled to PCB 210 and potentially coupled to the BOAC semiconductor chip package 10. However, these possible additional components are not shown in FIG. 5 so as to simplify the drawing.

The examples disclosed herein include BOAC semiconductor chip packages and manufacturing methods for BOAC semiconductor chip packages that prevent the deterioration of the conductive members via seed layer removal. As a result, through use of the example BOAC semiconductor chip packages (and the manufacturing methods thereof), the instances of conductive member deterioration and/or damage during manufacturing may be reduced, thereby increasing a reliability of the BOAC semiconductor chip packages overall.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

What is claimed is:

1. A method, comprising:
   forming an insulating member over a circuit on a device side of a semiconductor die;
   removing a portion of the insulating member to produce a cavity;
   forming a seed layer on the insulating member and within the cavity;
   forming a conductive member on the seed layer in the cavity, wherein the conductive member comprises a plurality of layers of different metal materials; and
   removing the seed layer from atop the insulating member, outside the cavity, after forming the conductive member in the cavity such that a remaining portion of the seed layer is positioned between the conductive member and the insulating member, wherein the seed layer abuts an outer perimeter of the conductive member.

2. The method of claim 1, wherein the conductive member comprises:
   an inner end coupled to the circuit;
   an outer end spaced from the inner end;
   a first portion comprising a first metal material extending from the inner end;
   a second portion extending from the first portion and comprising a second metal material; and
   a third portion extending from the second portion to the outer end and comprising a third metal material.

3. The method of claim 2, wherein the first metal material comprises Copper (Cu).

4. The method of claim 3, wherein the second metal material comprises Nickel (Ni) and the third metal material comprises Palladium (Pd).

5. The method of claim 3, wherein the third portion forms an outer surface of the conductive member, and wherein the outer surface is recessed inward from a top of the insulating member.

6. The method of claim 2, wherein the seed layer extends from the inner end to the outer end of the conductive member, within the cavity.

7. The method of claim 1, wherein a thickness of the seed layer is from 0.18 to 0.22 μm.

8. A method of making a semiconductor package, comprising:
   forming a polyimide layer over a circuit on a device side of a semiconductor die;
   removing a portion of the polyimide layer to produce a cavity;
   forming a seed layer on the polyimide layer and within the cavity;
   forming a copper bump on the seed layer in the cavity;
   forming a nickel layer over the copper bump;
   forming a palladium layer over the nickel layer; and
   removing the seed layer from atop the polyimide layer, outside the cavity, after forming the conductive member in the cavity such that a remaining portion of the seed layer is positioned between the conductive member and the insulating member, wherein the seed layer abuts an outer perimeter of the conductive member.

9. The method of claim 8 further comprising applying mold compound over the semiconductor die.

10. The method of claim 8, wherein the copper bump comprises an inner end coupled to the circuit and an outer end spaced from the inner end, wherein the nickel layer contacts the outer end.

11. The method of claim 8, wherein the seed layer contacts the nickel layer and the palladium layer.

12. The method of claim 8, wherein the semiconductor package includes a quad flat no-lead package.

* * * * *